(12) United States Patent
Dark et al.

(10) Patent No.: US 10,624,094 B2
(45) Date of Patent: *Apr. 14, 2020

(54) SPECTRAL STITCHING METHOD TO INCREASE INSTANTANEOUS BANDWIDTH IN VECTOR SIGNAL GENERATORS

(71) Applicant: NATIONAL INSTRUMENTS CORPORATION, Austin, TX (US)

(72) Inventors: Stephen L. Dark, Austin, TX (US); Daniel J. Baker, Cary, NC (US); Johnathan R. W. Ammerman, Spokane, WA (US)

(73) Assignee: National Instruments Corporation, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/918,905

(22) Filed: Mar. 12, 2018

(65) Prior Publication Data

US 2018/0206236 A1 Jul. 19, 2018

Related U.S. Application Data

(63) Continuation of application No. 14/611,700, filed on Feb. 2, 2015, now Pat. No. 9,609,653, which is a (Continued)

(51) Int. Cl.
*H04W 72/04* (2009.01)
*G01R 13/02* (2006.01)
(Continued)

(52) U.S. Cl.
CPC ....... *H04W 72/0453* (2013.01); *H03M 1/121* (2013.01); *H04B 1/0003* (2013.01);
(Continued)

(58) Field of Classification Search
CPC ............. H04W 72/0453; H04B 1/0025; H04B 1/0003; H03M 1/121; G01R 13/0272; G01R 23/165

See application file for complete search history.

(56) References Cited

U.S. PATENT DOCUMENTS 5,392,044 A 2/1995 Kotzin et al.
7,155,171 B2 12/2006 Ebert
(Continued)

OTHER PUBLICATIONS

International Search Report and Written Opinion in International Application No. PCT/US2015/055176, dated Dec. 8, 2015, 15 pages.

(Continued)

*Primary Examiner* — Mohamed A Kamara
(74) *Attorney, Agent, or Firm* — Kowert Hood Munyon Rankin and Goetzel PC; Jeffrey C. Hood; Matthew C. Washburn

(57) ABSTRACT

Embodiments are described of devices and methods for processing a signal using a plurality of vector signal generators (VSGs). A digital signal may be provided to a plurality of signal paths, each of which may process a respective frequency band of the signal, the respective frequency bands having regions of overlap. The gain and phase of each signal path may be adjusted such that continuity of phase and magnitude are preserved through the regions of overlap. The adjustment of gain and phase may be accomplished by a complex multiply with a complex calibration constant. The calibration constant may be determined for each signal path by comparing the gain and phase of one or more calibration tones generated within each region of overlap. Each signal path may comprise a VSG to convert the respective signal to an analog signal, which may be combined to obtain a composite signal.

14 Claims, 5 Drawing Sheets

Related U.S. Application Data continuation-in-part of application No. 14/515,144, filed on Oct. 15, 2014, now Pat. No. 9,326,174.

(51) Int. Cl.
   *H03M 1/12* (2006.01)
   *H04B 1/00* (2006.01)
   *G01R 23/165* (2006.01)

(52) U.S. Cl.
   CPC ....... *H04B 1/0025* (2013.01); *G01R 13/0272* (2013.01); *G01R 23/165* (2013.01)

(56) References Cited

U.S. PATENT DOCUMENTS

| | | | |
|---|---|---|---|
| 7,518,353 B2 | 4/2009 | Tanbakuchi | |
| 7,693,502 B2* | 4/2010 | Sorrells | H03C 1/62 |
| | | | 455/313 |
| 7,957,938 B2 | 6/2011 | LaMarche | |
| 8,264,390 B2 | 9/2012 | Pagnanelli | |
| 8,437,385 B1 | 5/2013 | Dark | |
| 8,798,207 B2 | 8/2014 | Wertz | |
| 8,849,602 B2 | 9/2014 | Nishimura | |
| 8,873,610 B2 | 10/2014 | Dark | |
| 9,019,912 B2 | 4/2015 | Marini | |
| 9,048,865 B2 | 6/2015 | Pagnanelli | |
| 9,325,435 B2 | 4/2016 | Olgaard | |
| 9,326,174 B1* | 4/2016 | Dark | H04B 17/309 |
| 9,609,653 B2* | 3/2017 | Dark | H04B 1/0003 |
| 2004/0252044 A1 | 12/2004 | Mathis et al. | |
| 2007/0165743 A1* | 7/2007 | McCallister | H04B 1/0075 |
| | | | 375/296 |
| 2008/0176575 A1* | 7/2008 | Sutton | H04L 5/0007 |
| | | | 455/450 |
| 2011/0045788 A1 | 2/2011 | Kundur Subramaniyan et al. | |
| 2014/0105256 A1 | 4/2014 | Hanevich et al. | |

OTHER PUBLICATIONS

Communication Pursuant to Article 94(3) EPC in European Patent Application No. 15787792.9, dated Mar. 14, 2018, 7 pages.
Nokia et al., "Consideration of some RF requirements for DC-HSUPA", 3GPP Draft; R4-092448, 3rd Generation Partnership Project (3GPP), Los Angeles, CA, USA Jun. 28, 2009-Jul. 2, 2009, XP050353676, 2 pages.
Ericsson Inc., "Mobile Station (MS) Conformance Specification", 3GPP Draft; GP-020566, 3rd Generation Partnership Project (3GPP), Seattle, WA, USA Feb. 15, 2002-Feb. 19, 2002, 7 pages, XP50005293A.
Communication Pursuant to Article 94(3) EPC in European Patent Application No. 15787792.9, dated Dec. 17, 2018, 4 pages.

* cited by examiner

SPECTRAL STITCHING METHOD TO INCREASE INSTANTANEOUS BANDWIDTH IN VECTOR SIGNAL GENERATORS

PRIORITY INFORMATION

This application is a continuation of U.S. patent application Ser. No. 15/425,304, entitled "Spectral Stitching Method to Increase Instantaneous Bandwidth in Vector Signal Generators," filed Feb. 6, 2017, now U.S. Pat. No. 9,918,316 to be issued Mar. 13, 2018, with inventors Stephen L. Dark et al., which is a continuation of U.S. patent application Ser. No. 14/611,700, entitled "Spectral Stitching Method to Increase Instantaneous Bandwidth in Vector Signal Generators", filed Feb. 2, 2015, with inventors Stephen L. Dark et al., which is a continuation-in-part application of U.S. patent application Ser. No. 14/515,144, entitled "Spectral Stitching Method to Increase Instantaneous Bandwidth in Vector Signal Analyzers", filed Oct. 15, 2014, now U.S. Pat. No. 9,326,174 issued Apr. 26, 2016, with inventors Stephen L. Dark et al., each of which is hereby incorporated by reference as though fully and completely set forth herein.

FIELD OF THE INVENTION

The present invention relates to the field of signal processing, and more particularly to systems and methods for increasing instantaneous bandwidth in a vector signal analyzer or a vector signal generator.

DESCRIPTION OF THE RELATED ART

Instantaneous bandwidth is an important banner specification for all radio frequency (RF) vector signal analyzers (VSAs) and RF vector signal generators (VSGs). The desire of the industry is to increase the bandwidth as much as possible without sacrificing dynamic range. In many cases, the limiting factor in achieving the largest possible bandwidth is the sample rate of the analog-to-digital converters (ADCs) and digital-to-analog converters (DACs). While ADC and DAC vendors are always working to increase the converter rates, there still exists a desire in many applications for bandwidths that exceed the capabilities of state-of-the-art ADCs and DACs. There are several different methods within the industry for achieving larger bandwidths, each with their own disadvantages.

The prior methods for creating larger instantaneous bandwidths that do not intentionally sacrifice resolution fall into two categories: (1) Time-Interleaving (time) and (2) Quadrature Mixing (phase). Both of these methods are industry standards for increasing bandwidth.

Time-Interleaving uses converters that have larger bandwidths than their sample rates allow. For ADCs, this is made possible by placing faster sample-and-hold circuits on the front-end than the ADC backend is capable of digitizing. Then, by taking N ADCs and staggering them in time by the ADC sample period divided by N, the samples can be interleaved together to create an effective larger sample rate. This method introduces errors resulting from inaccuracies in staggering the time alignment and from differences in the magnitude and phase between the various ADCs. Therefore, several online and offline DSP correction algorithms have been created to combat these effects. In general, it is difficult to achieve more than 8 bits of dynamic range without DSP correction. With offline DSP correction, this can be improved to better than 12 bits of dynamic range but can be very sensitive to temperature. Online methods typically have to assume something about the input signal, and other negative effects occur when those assumptions are broken.

Quadrature mixing uses a quadrature down-converter or up-converter to mix an RF signal into or from two signals, an in-phase signal and a quadrature-phase signal. In the case of a down-converter, the RF signal is mixed with a sinusoid to create the in-phase signal and the same RF signal is mixed with a sinusoid that is 90 degrees out of phase with the in-phase sinusoid to create the quadrature phase signal. Finally, each of these two analog signals is digitized with ADCs. These two signals are typically represented as a single complex signal, where the in-phase signal represents the real part and the quadrature-phase part of the signal represents the imaginary part. As a result, the positive frequency bandwidth is independent of the negative frequency bandwidth. Thus the net effect is a doubling of the bandwidth. Using this method, the full resolution of the data converters is preserved. However, this method typically creates a DC leakage spur and an image spur. In addition, the method only scales to two converts.

Thus, there exists a need for mechanisms capable of achieving the goal of larger instantaneous or modulation bandwidths from smaller bandwidths without the scalability and image rejection issues of the quadrature mixing technique and without the inaccuracies present for time interleaving methods.

SUMMARY

Methods and systems are disclosed for processing a digital signal using a plurality of parallel processing paths. In a presented method, each of the plurality of parallel processing paths may be provided with a respective component signal comprising a copy of a respective frequency band of an input signal. The combination of the respective frequency bands may comprise an aggregate frequency band having an aggregate center frequency. Each respective frequency band may have a respective region of overlap with at least one other respective frequency band. Each respective frequency band may also have a respective center frequency with a respective frequency offset from the aggregate center frequency. At least a portion of each of the parallel processing paths may be phase-locked and time-synchronized with respect to the other parallel processing paths.

Each of the parallel processing paths may process the provided respective component signal. The processing may comprise frequency-shifting, filtering, and adjusting the gain and phase of the respective component signal, and converting the respective component signal to an analog signal. The frequency-shifting may comprise shifting the respective component signal such that the respective center frequency is shifted to baseband. The filtering the respective component signals may be configured to cause a sum of the component signals to have a unity frequency response within each region of overlap. The filtering may be performed using a digital half-band filter. The adjusting gain and phase of the respective component signals may be configured to cause the sum of the component signals to have a continuous frequency response over the aggregate frequency band. The converting the respective component signal to an analog signal may comprise using a respective vector signal generator associated with the respective parallel processing path. The converting may comprise further frequency-shifting the respective component signals to cause the aggregate center frequency to be located at a desired carrier frequency, and each respective center frequency to be offset from the desired carrier frequency by the respective frequency offset.

Optionally, the processing may include additional steps, such as decimating the respective component signal to a rate that is less than or equal to a maximum sample rate of the respective vector signal generator.

The method may further comprise combining the respective component signals to obtain a composite signal.

An apparatus is presented for processing a digital signal. The apparatus may comprise a digital signal processor comprising a plurality of parallel processing paths. The digital signal processor may be configured to provide to each of the parallel processing paths a respective component signal comprising a copy of at least a respective frequency band of the digital signal. Each respective frequency band may have a respective center frequency and a respective region of overlap with at least one other respective frequency band. The combination of the respective frequency bands may comprise an aggregate frequency band having an aggregate center frequency, wherein the respective center frequency of each respective frequency band has a respective frequency offset from the aggregate center frequency. At least a portion of each of the parallel processing paths may be phase-locked and time-synchronized with respect to the other parallel processing paths. Each of the parallel processing paths may be configured to frequency-shift, filter, and adjust the gain and phase of the respective component signal, as discussed above. Optionally, each of the parallel processing paths may be further configured to perform additional steps, such as decimating the respective component signal to a rate that is less than or equal to a maximum sample rate of the respective vector signal generator.

The apparatus may further comprise a plurality of output ports, each configured to provide to a respective vector signal generator (VSG) an output of one of the plurality of parallel processing paths. The apparatus may further comprise a plurality of input ports, each configured to receive from a respective VSG a respective analog signal comprising an analog version of the output of the respective one of the plurality of output ports. Each respective analog signal received at one of the input ports may have been frequency-shifted relative to the respective output of the respective output port, such that the aggregate center frequency is located at a desired carrier frequency, and each respective center frequency is offset from the desired carrier frequency by the respective frequency offset. The apparatus may further comprise a signal combiner configured to combine the respective analog signals to obtain a composite signal.

A method is presented for calibrating a signal processing system including at least a first vector signal generator (VSG) and a second VSG. The method may comprise providing to a first signal processing path comprising the first VSG a first digital component signal comprising a first frequency band within an aggregate frequency band of a digital input signal. The aggregate frequency band may have an aggregate center frequency, and the first frequency band may have a first center frequency at a first frequency offset from the aggregate center frequency. The method may further comprise providing to a second signal processing path comprising the second VSG a second digital component signal comprising a second frequency band within the aggregate frequency band of the digital input signal. The second frequency band may have a second center frequency at a second frequency offset from the aggregate center frequency. The second frequency band may also have a region of overlap with the first frequency band, the region of overlap containing a calibration tone. The second VSG may be phase-locked and time-synchronized with respect to the first VSG.

The method may further comprise frequency shifting each of the first and second component signals, such that the first center frequency and the second center frequency are each shifted to baseband. The method may further comprise converting the first and second digital component signals to first and second analog component signals, respectively, using the first VSG and the second VSG. Converting the first and second digital component signals may comprise shifting each of the first and second component signals, such that the aggregate center frequency is located at a desired carrier frequency, and each respective center frequency is offset from the desired carrier frequency by the respective frequency offset.

The method may further comprise computing a complex calibration constant based on a magnitude ratio and a phase difference. The magnitude ratio may be determined by a magnitude of the calibration tone as output by the first VSG and a magnitude of the calibration tone as output by the second VSG. The phase difference may be determined by a phase of the calibration tone as output by the first VSG and a phase of the calibration tone as output by the second VSG. For example, computing the complex calibration constant may comprise disabling the output of the second VSG, measuring the magnitude and phase of the calibration tone as output by the first VSG while the output of the second VSG is disabled, disabling the output of the first VSG and enabling the output of the second VSG after said measuring, and measuring the magnitude and phase of the calibration tone as output by the second VSG while the output of the first VSG is disabled. As another example, computing the complex calibration constant may comprise iteratively adjusting the magnitude and phase of the second VSG to cause deconstructive interference between the calibration tone as output by the first VSG and the calibration tone as output by the second VSG, such that the total power at the frequency of the calibration tone as output by the first VSG and the second VSG is minimized; and computing the complex calibration constant as the adjustment made to the magnitude and phase of the second VSG, rotated by 180 degrees. As another example, two calibration tones may be at different frequencies but with a known relationship. In this case both the first VSG and the second VSG may each generate a respective calibration tone at the same time in a synchronized manner, and the magnitude and phase differences may be simultaneously sampled. The complex calibration constant may be computed by taking into consideration the known relationship between the calibration tones.

The method may further comprise storing the complex calibration constant in memory, wherein the complex calibration constant is useable to correct phase and gain mismatch between the first VSG and the second VSG. The first VSG may comprise a first local oscillator and the second VSG comprises a second local oscillator. Optionally, the phases of the first local oscillator and the second local oscillator may be deterministic, such that the stored complex calibration constant is useable to correct phase and gain mismatch between the first VSG and the second VSG without recalibration, even after phase lock between the first VSG and the second VSG is lost and reacquired.

Optionally, the method may include additional steps, such as filtering each of the first and second component signals, and/or decimating each of the first and second component signals, as discussed above.

BRIEF DESCRIPTION OF THE DRAWINGS

A better understanding of the present inventions can be obtained when the following detailed description is considered in conjunction with the following drawings.

Figure 1:
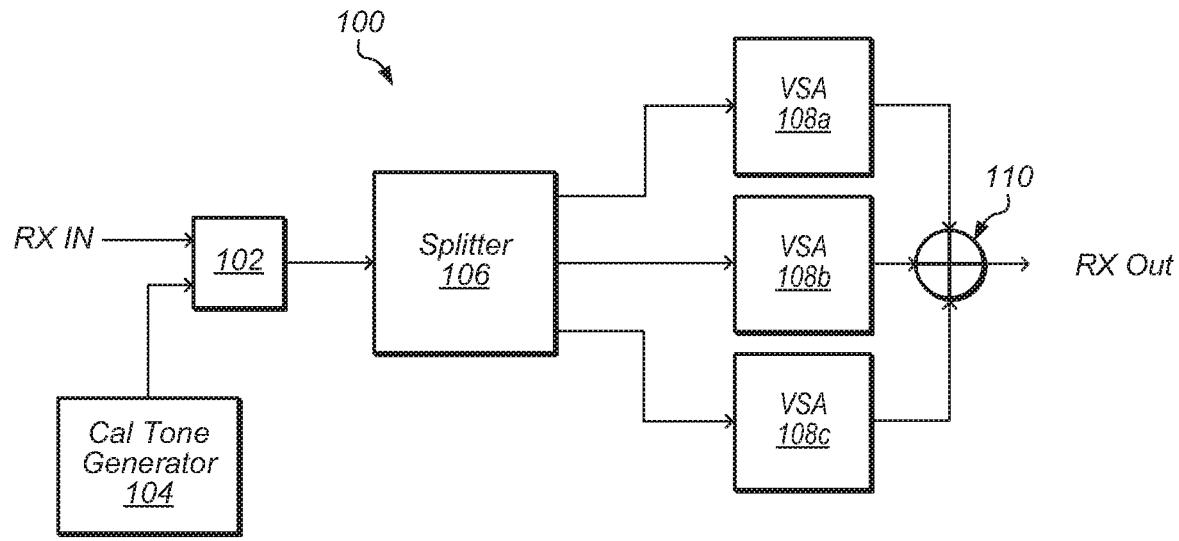
FIG. 1 is a block diagram illustrating an embodiment of a system for performing spectral stitching in a receive path.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note that the various section headings in the following Detailed Description are for organizational purposes only and are not meant to be used to limit the claims.

DETAILED DESCRIPTION

Incorporation by Reference

The following references are incorporated by reference as if fully and completely disclosed herein:

U.S. Patent Application No. 2013/0343490, filed Jun. 20, 2012, entitled "Synchronizing Receivers in a Signal Acquisition System", invented by Wertz et al.;

U.S. Pat. No. 7,624,294, issued on Nov. 24, 2009, entitled "Synchronizing Measurement Devices Using Trigger Signals", invented by Craig M. Conway; and U.S. Pat. No. 7,315,791, issued on Jan. 1, 2008, entitled "Application Programming Interface for Synchronizing Multiple Instrumentation Devices", invented by Kosta Ilic et al.

Terminology

The following is a glossary of terms used in the present application:

Memory Medium—Any of various types of memory devices or storage devices. The term "memory medium" is intended to include an installation medium, e.g., a CD-ROM, floppy disks 105, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Local Oscillator (LO)—a circuit configured to generate a periodic signal at a specified frequency and amplitude. The periodic signal may be a pure sinusoid, and its frequency and/or amplitude may be programmable. The periodic signal may or may not be phase or frequency locked to another periodic signal.

Overview

Time interleaving uses time as the mechanism to increase the bandwidth while quadrature mixing uses phase as its mechanism. The present "spectral stitching" approach uses frequency as its mechanism to achieve larger instantaneous bandwidths. The spectral stitching approach may be applied to both signal receivers, such as RF (radio frequency) receivers, for example, and signal generators, such as RF generators, for example, as discussed below. As used herein, the term "RF" is intended to include the full spectrum of communication frequencies, and includes at least radio and microwave frequencies.

Embodiments of the present invention may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a tablet computer, a wearable computer, etc.

Receive Path

In a receive path, spectral stitching may be performed by using a plurality N of vector signal analyzers (VSAs) to digitize an analog input receive (RX) signal, such as an RF signal, where each VSA handles a respective frequency band of the signal. Together the respective frequency bands comprise an aggregate frequency band of interest. The outputs of the N VSAs may therefore be recombined to form a composite signal having a bandwidth on the order of N times the bandwidth of each individual VSA, thus covering the entire aggregate frequency band. The aggregate frequency band may be a region of interest within the input RX signal.

FIG. 1 illustrates a block diagram of an embodiment of a system 100 for performing spectral stitching in a signal path receiving an inputRX signal. As shown in FIG. 1, the system 100 includes three VSAs 108a-c. Other embodiments may include another number N of VSAs. It should be appreciated that the terms "VSA" and "vector signal analyzer," as used herein, may encompass any type of signal analyzer, digitizer, receiver, or other device capable of converting, or configured to convert, an analog input signal to a digital output signal.

One or more calibration tones may be added to the inputRX signal to aid in calibrating the plurality of VSAs, as discussed below. In some embodiments, the one or more calibration tones may be generated by calibration tone generator 104, and added to the input signal by a power combiner 102. In other embodiments, the one or more calibration tones may be added to the input signal using a simple two-port mux, or using any other signal combining technique known in the art. In some embodiments, the system 100 may include multiple calibration tone generators, which may require the power combiner 102 to have more than two inputs. The one or more calibration tones may be generated and added to the input signal while the system 100 is operating in a calibration mode, as discussed below. Thus, in normal operation, the power combiner 102 may not add the one or more calibration tones to the input signal.

A copy of at least a portion of the inputRX signal may be provided to each of the VSAs 108a-c. This may be accomplished by splitting the input signal, such as by using a power splitter 106, having N outputs.

The output of each VSA 108a-c may be provided to a summing unit 110. The output of the summing unit 110 is a composite signal representing the sum of the output of each of the VSAs 108a-c.

As mentioned previously, each of the VSAs 108a-c may handle a different frequency band of the inputRX signal. To ensure continuity across the full aggregate frequency band, the different frequency bands handled by the respective VSAs 108a-c should overlap. Thus, in order for the sum of the outputs of the VSAs 108a-c to accurately represent a digitized version of the aggregate frequency band of the inputRX signal, the outputs of the VSAs 108a-c may be further processed to provide continuity through the regions of overlap. Each of the VSAs 108a-c may therefore comprise signal processing capabilities beyond those traditionally included in a VSA. In some embodiments, each of the VSAs 108a-c may not comprise a stand-alone VSA. For example, each of the VSAs 108a-c may be implemented as a signal processing path on a programmable hardware element, multiprocessor system, etc.

Figure 2:
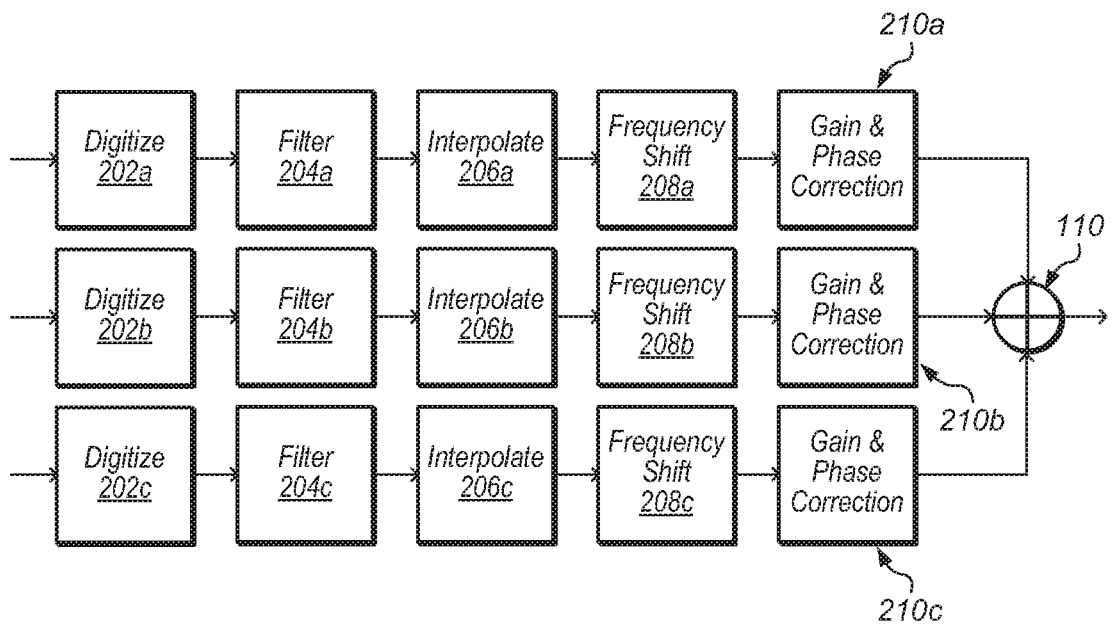
FIG. 2 is a block diagram illustrating an embodiment of parallel vector signal analyzers (VSAs)

FIG. 2 illustrates a block diagram providing further detail of an embodiment of the VSAs 108a-c. Specifically, blocks 202a-210a represent details of an embodiment of VSA 108a, blocks 202b-210b represent details of an embodiment of VSA 108b, and blocks 202c-210c represent details of an embodiment of VSA 108c. Summing unit 110 is also included in FIG. 2 for context.

At each of the digitize blocks 202a-c, a component signal comprising a respective frequency band of the inputRX signal may be digitized. Each of the digitize blocks 202a-c may include functionality included in a traditional VSA.

In some embodiments, each of the digitize blocks 202a-c may receive a copy of the entire inputRX signal, e.g. from the signal splitter 106. In other embodiments, each of the digitize blocks 202a-c may receive only a respective portion of the inputRX signal. Because each of the VSAs 108a-c may handle a different frequency band of the inputRX signal, each of the digitize blocks 202a-c may digitize a respective component signal comprising a respective frequency band, each respective frequency band identified by a respective center frequency.

Figure 3A:
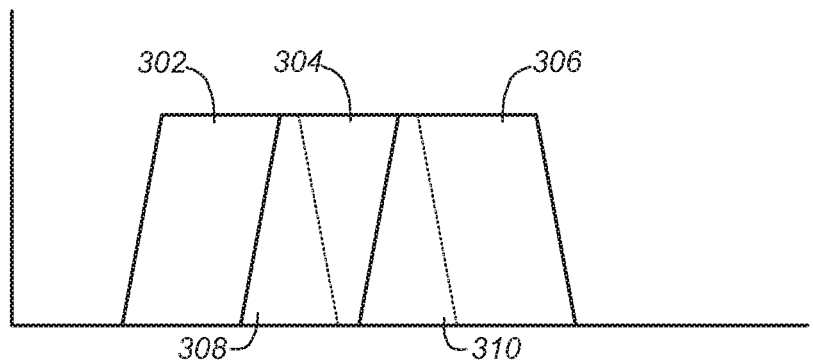
FIGS. 3a, 3b, and 3c illustrate exemplary embodiments of respective frequency bands within an aggregate frequency band with and without calibration tones.

FIG. 3a illustrates an exemplary embodiment of frequency bands as received by the digitize blocks 202a-c, represented in the frequency domain. In this example, frequency band 302 represents the frequency band of the digitize block 202a (i.e. VSA 108a), frequency band 304 represents the frequency band of the digitize block 202b (i.e. VSA 108b), and frequency band 306 represents the frequency band of the digitize block 202c (i.e. VSA 108c). The region covered by frequency bands 304-306 together represents the aggregate frequency band identified by an aggregate center frequency. Each respective center frequency is offset from the aggregate center frequency by a respective frequency offset. In some circumstances a respective center frequency may be offset from the aggregate center frequency by 0 Hz, as in the example of frequency band 304.

The frequency bands may overlap to avoid gaps within the aggregate frequency band. For example, the region 308 represents a region of overlap between frequency band 302 and frequency band 304 (i.e. between the respective component signals of VSAs 108a and 108b), and the region 310 represents the region of overlap between frequency band 304 and frequency band 306 (i.e. between the respective component signals of VSAs 108b and 108c).

The digitizing performed by each of the digitize blocks 202a-c may comprise performing I/Q demodulation on the respective component signal to produce a pair of analog I (in-phase) and Q (quadrature) signals.

The digitizing performed by each of the digitize blocks 202a-c may also comprise frequency-shifting the respective component signal (or the I/Q signal pair) such that the respective center frequency is shifted to baseband. Each of the digitize blocks 202a-c may then filter out portions of the shifted signal that are outside the respective frequency band, e.g. by using a low-pass filter. Alternatively, each of the digitize blocks 202a-c may frequency-shift the received inputRX signal to a position other than baseband (or forego frequency-shifting), and filter the shifted signal using a band-pass filter.

In one embodiment, each of the digitize blocks 202a-c may comprise a respective local oscillator (LO) operating at the respective center frequency. The respective LO may be used, for example, in frequency-shifting the respective center frequency to baseband. The LOs of the digitize blocks 202a-c may have a fixed phase difference relative to each other. For example, the LOs may be locked to a common reference, such that the relative phases between the devices will remain fixed.

The digitizing performed by each of the digitize blocks 202a-c may further comprise complex sampling the filtered signal, as known in the art. The VSAs 108a-c may be time-synchronized, such that the respective signals may be sampled simultaneously in each of the digitize blocks 202a-c. Alternatively, the respective signals may be sampled at a consistent offset of time. In this case, the consistent offset may be measured and corrected. Each of the digitize blocks 202a-c may output a complex (I/Q) signal.

At filter blocks 204a-c, the respective component signals may be filtered. Because the respective frequency bands of the respective component signals overlap in frequency, as shown in FIG. 3, the overlap regions should be filtered to prevent power spikes, or other artificial increases in magnitude, in the overlap regions when the respective signals are summed by summing unit 110. In other words, the respective component signals should be filtered such that their sum appears continuous. Specifically, the respective component signals may be filtered such that the sum of overlapping signals provides a unity response at all points within the aggregate frequency band. More generally, this continuous-sum filtering may be configured in any manner such that the summed signals approximate the result that would be achieved if the entire aggregate frequency band had been digitized by a single VSA having sufficient bandwidth to digitize the entire aggregate frequency band.

Figure 4:
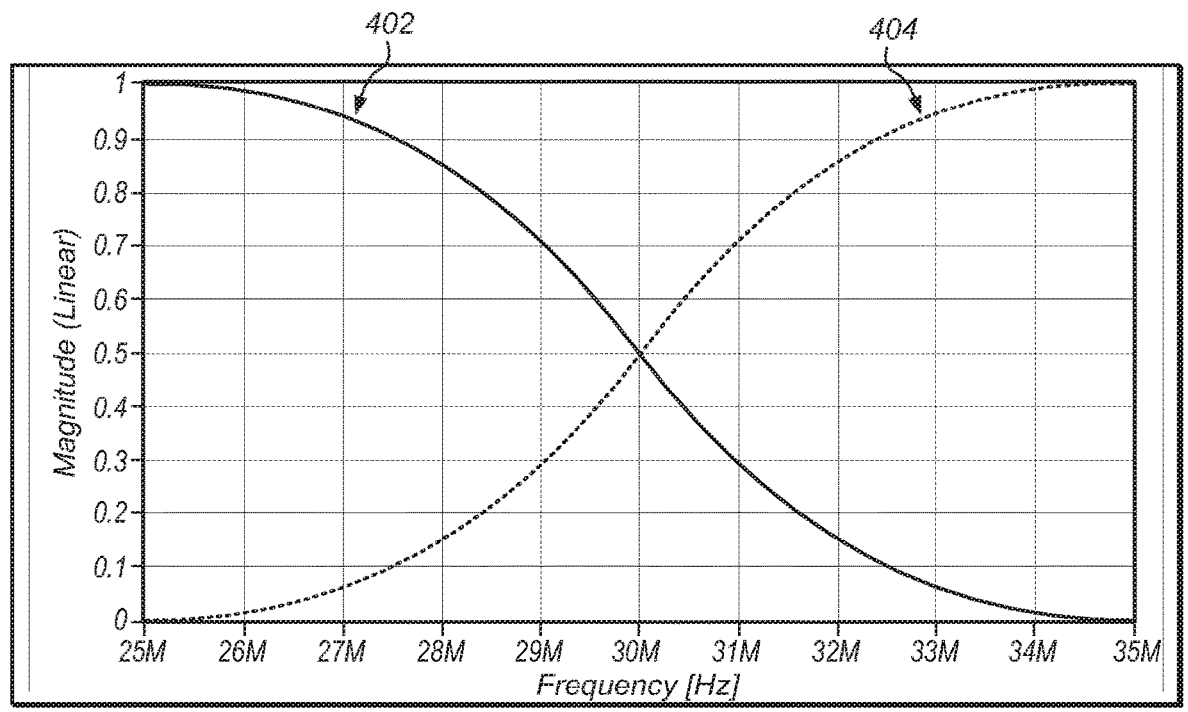
FIG. 4 illustrates the signal response of a half-band filter.

Various filter shapes may be used to accomplish this. For example, FIG. 4 illustrates the response of a half-band filter, where the solid trace 402 represents a filter response for a first VSA and the dotted trace 404 represents a filter response for a second VSA with an overlapping frequency band. In FIG. 4, the crossover point is located at 30 MHz where there is a 10 MHz crossover region. While a half-band filter inherently has the needed spectral characteristics to filter overlapping frequency bands to sum together to produce unity gain, it forces the crossover point to occur at the sampling frequency divided by four, fs/4. In other embodiments, this crossover may be moved further out in frequency using other filter methods, e.g., to increase the effectiveness of the natural instantaneous bandwidth of each device.

The filtering illustrated as filter blocks 204a-c may happen at any of various points in the VSA. For example, the filtering may occur after the interpolate blocks 206a-c. Alternatively, some embodiments may perform the filtering of the filter blocks 204a-c within the digitize blocks 202a-c, e.g., concurrently with the low-pass filtering of the digitize blocks 202a-c. In this case, the filtering may be performed by an analog filter prior to complex sampling of the filtered signal.

At interpolate blocks 206a-c, each respective component signal may be interpolated. The interpolation factor should be set such that each respective interpolate block 206 interpolates the respective component signal to at least the effective I/Q rate required for the "stitched" data's bandwidth. For example, in one embodiment, the effective I/Q rate may be required to be at least the Nyquist rate of the respective component signal. In another embodiment, a higher rate (e.g., 1.25 times the Nyquist rate) may be selected.

At frequency shift blocks 208a-c, each respective component signal may be shifted into the proper location in frequency relative to the other devices. As a result, each device will frequency shift its interpolated spectrum to a different location. Specifically, each respective component signal may be shifted such that its respective center frequency is offset from baseband by the respective frequency offset by which it was originally offset from the aggregate center frequency. Thus, the entire aggregate frequency band is frequency shifted to center at baseband.

For example, in the case that there are three VSAs each using half-band filters with an I/Q rate of 120 MHz, then the cross-over points will be located at positive and negative 30 MHz. This means that the three respective center frequencies may be shifted to [−60 MHz, 0 Hz, 60 MHz]. Thus, the respective frequency bands should be defined such that the respective frequency offsets are [−60 MHz, 0 Hz, 60 MHz] relative to the aggregate center frequency.

If the digitize blocks 202a-c previously shifted the respective center frequencies to baseband, then VSA 108a may, in this example, frequency shift its spectrum to the left by 60 MHz, VSA 108b may shift by 0 Hz, and VSA 108c may frequency shift its spectrum to the right by 60 MHz. In other words, each respective center frequency may be shifted by its respective frequency offset. In embodiments in which the respective frequencies were shifted by the digitize blocks 202a-c to a frequency other than baseband, then the respective center frequencies may be shifted by some value other than the respective frequency offsets.

At the gain and phase correction blocks 210a-c, the magnitude and phase of each respective component signal may be adjusted to make the spectrum continuous through the regions of overlap. This gain and phase correction may comprise a complex multiply of each of one or more of the respective component signals with a respective calibration constant. Determining a calibration constant for each of the gain and phase correction blocks 210a-c is discussed below.

Where the VSAs 108a-c are not time-synchronized, but have a constant delay relative to each other, the gain and phase correction blocks 210a-c may be further configured to measure and correct the delay.

Figure 5:
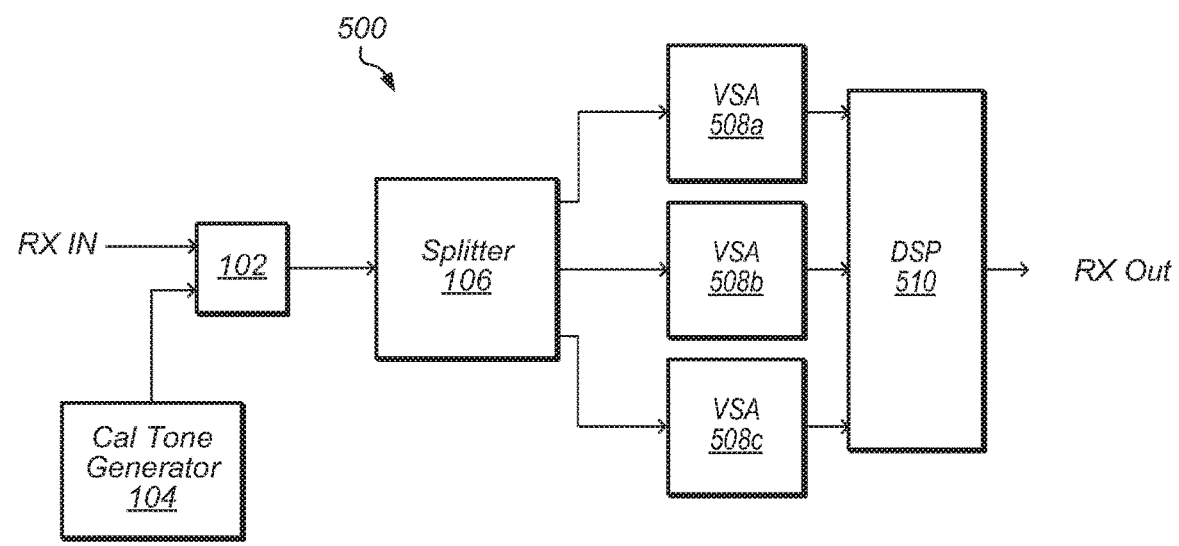
FIG. 5 is a block diagram illustrating another embodiment of a system for performing spectral stitching in a receive path.

FIG. 5 illustrates a block diagram of an embodiment of a second system 500 for performing spectral stitching in a signal path receiving an inputRX signal. As shown in FIG. 5, the system 500 includes three VSAs 508a-c. Other embodiments may include another number N of VSAs.

In FIG. 5, the power combiner 102, the calibration tone generator 104, and the power splitter 106 may operate as described with regard to FIG. 1. The VSAs 508a-c may be standard VSAs as known in the art, without the additional signal processing capabilities of VSAs 108a-c. Instead, the additional signal processing functions may be performed by a separate digital signal processing block 510. For example, the digital signal processing block 510 may perform the functions of filtering, interpolating, frequency shifting, and gain and phase correction, as discussed with regard to FIG. 2, blocks 204-210, for each of the VSAs 508a-c. For example the digital signal processing block 510 may comprise a separate signal processing path for processing the output of each of the VSAs 508a-c. The digital signal processing block 510 may further comprise a summing function, which may function in a manner similar to the summing unit 110.

The system 500 presents an advantage over the system 100, in that the system 500 may allow a user to utilize standard, off-the-shelf VSAs. For example, system 500 may be realized in the form of a signal processing chassis comprising the digital signal processing block 510, and optionally further comprising one or more of the power combiner 102, the calibration tone generator 104, and the power splitter 106. The signal processing chassis may further comprise slots to accept a plurality of VSAs, which may be standard, off-the-shelf VSAs. The signal processing chassis may be configured to operate with a variable number of VSAs, according to the preferences of the user. Further, the VSAs may differ in bandwidth, resolution, or other characteristics, according to the preferences of the user.

Determining VSA Calibration Constants

In order to adjust the magnitudes and phases of the respective signals in the receive path to provide continuity through the regions of overlap, the relative magnitudes and phases between the respective signals without adjustment may be determined. This may be performed by injecting a calibration tone at each crossover point, or region of overlap, of the respective frequency bands. The calibration tone may then be measured and compared by the VSAs. Differences and/or ratios between the measurements by different VSAs of the magnitude and phase of the calibration tone may be used to determine calibration constants for each of the VSAs.

For example, to determine calibration constants for a system such as the system 100 shown in FIGS. 1-2, or the system 500 shown in FIG. 5, the system may be set to a calibration mode. The calibration mode will be discussed herein with respect to the system 100 shown in FIGS. 1-2. However, the same principles may be applied to other embodiments, such as the system 500.

As shown in FIG. 1, the power combiner 102 may be used to combine the input signal with one or more calibration tones from the calibration tone generator 104. A calibration tone may comprise a real tone at a single known frequency falling within a region of overlap. A calibration tone may also have a known magnitude. In some embodiments, a calibration tone may be injected at a single region of overlap at a time, with each region of overlap being treated sequentially. In other embodiments, calibration tones may be injected at multiple, or all, regions of overlap simultaneously. The combined signal may then be used as the input to the splitter 106 where each of the splitter's outputs may be the input to one of N VSAs, such as VSAs 108a-c.

Figure 3B:
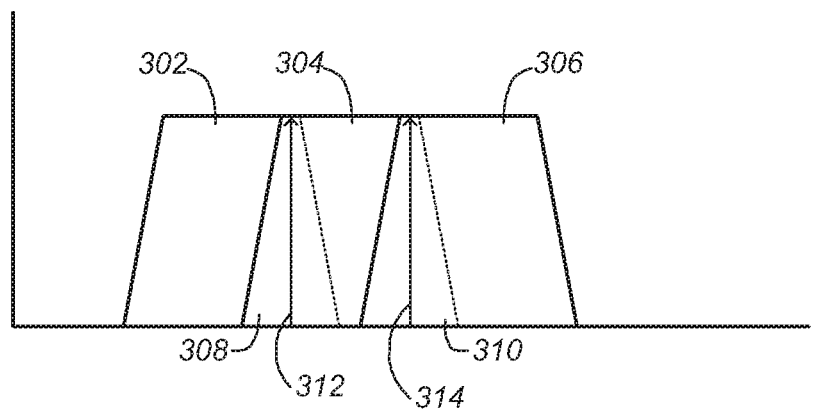

At the N VSAs, each of the N-1 regions of overlap may comprise a respective calibration tone, as shown in FIG. 3b (either simultaneously or sequentially). As illustrated, calibration tone 312 may be generated within region of overlap 308 (i.e. within the respective signals of VSAs 108a and 108b), and calibration tone 314 may be generated within region of overlap 310 (i.e. within the respective signals of VSAs 108b and 108c).

At blocks 202-208, each respective signal may be digitized, filtered, interpolated, and frequency shifted, as discussed above with regard to FIG. 2. However, the gain and phase correction block 210 may operate differently in the calibration mode. Specifically, the gain and phase correction block 210 may measure the respective calibration tone within each region of overlap. For example, the gain and phase correction block 210a (of VSA 108a) may measure the calibration tone 312, since it falls within the respective frequency band 302, which is processed by the VSA 108a. The gain and phase correction block 210b (of VSA 108b) may also measure the calibration tone 312, since it also falls within the respective frequency band 304, which is processed by the VSA 108b.

Figure 6A:
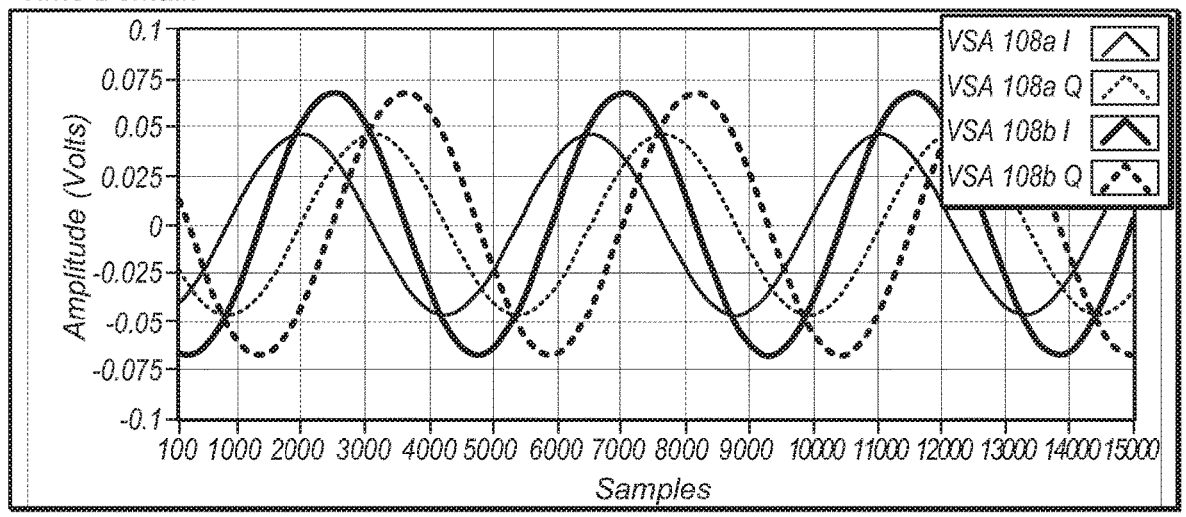
FIGS. 6a and 6b illustrate measurements of a calibration tone, as performed by two VSAs before and after phase and magnitude adjustment, represented in the time domain.

FIG. 6a illustrates exemplary results of measurements of the calibration tone 312, as performed by the VSAs 108a and 108b, represented in the time domain. As illustrated, the in-phase (I) and quadrature (Q) components of the calibration tone 312 as measured by the VSA 108a have a phase and magnitude that are different from the phase and magnitude of the I and Q components of the calibration tone 312 as measured by the VSA 108b. This may result from normal differences in the hardware, temperature, etc. of the VSAs 108a and 108b. In this condition, the sum of the respective signals output by the VSAs 108a and 108b will not be continuous through the region of overlap, because of the mismatch in phase and magnitude.

Figure 6B:
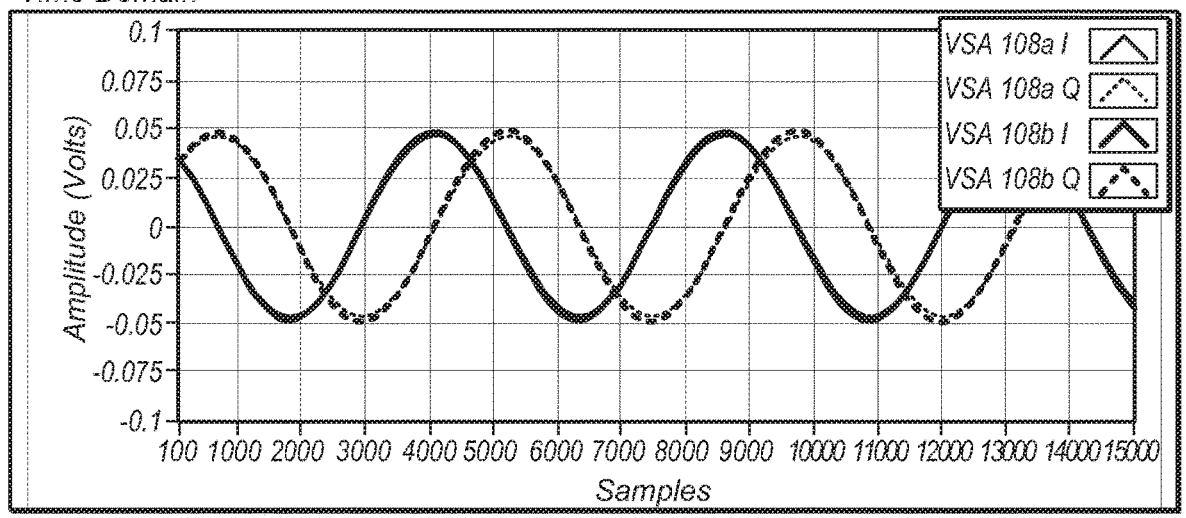

Using the measurements of the calibration tone within each region of overlap, respective calibration constants may be determined, for use in realigning the respective signals through each region of overlap. For example, for each respective VSA, a complex calibration constant may be determined that, when complex multiplied by a calibration tone measured by that respective VSA, will result in an output calibration tone having a phase and magnitude matching an output calibration tone of an adjacent VSA. FIG. 6b illustrates output calibration tones of VSAs 108a and 108b. The output calibration tones shown in FIG. 6b represent the signals shown in FIG. 6a after being multiplied by the determined calibration constants.

In one embodiment, the magnitudes of the calibration tones generated by the calibration tone generator 104 may be known. The calibration constants may therefore be determined such that the output calibration tones have a magnitude matching the generated calibration tones. In another embodiment, the calibration constants may merely be determined such that the output calibration tones produced by adjacent VSAs have the same magnitude.

For example, calibration tone 312 may be measured by both VSA 108a and VSA 108b. Calibration tone 314 may be measured by both VSA 108b and VSA 108c. The output signal of VSA 108a will include an output calibration tone corresponding to calibration tone 312. The output signal of VSA 108b will include output calibration tones corresponding to calibration tone 312 and calibration tone 314. The output signal of VSA 108c will include an output calibration tone corresponding to calibration tone 314.

A first calibration constant may optionally be determined for VSA 108a such that complex multiplication of the first calibration constant with the output signal of VSA 108a results in the output calibration tone corresponding to calibration tone 312 having a magnitude matching the known magnitude of calibration tone 312.

A second calibration constant may be determined for VSA 108b such that complex multiplication of the second calibration constant with the output signal of VSA 108b results in the output calibration tone corresponding to calibration tone 312 having a phase matching the phase of the output calibration tone of VSA 108a. The second calibration constant may further be determined such that the output calibration tone corresponding to calibration tone 312 has a magnitude matching the known magnitude of calibration tone 312 and/or the magnitude of the output calibration tone of VSA 108a corresponding to calibration tone 312. In one embodiment, a calibration constant determined to cause the output calibration tone of 108b to match the phase and magnitude of the output calibration tone of VSA 108a may be determined by performing a complex division of the calibration tone 312 as measured by VSA 108a by the calibration tone 312 as measured by VSA 108b. Because the complex multiplication of the second calibration constant is performed with the entire output signal of VSA 108b, the output calibration tone of VSA 108b corresponding to calibration tone 314 is also adjusted.

A third calibration constant may be determined for VSA 108c such that complex multiplication of the third calibration constant with the output signal of VSA 108c results in the output calibration tone corresponding to calibration tone 314 having a phase matching the phase of the adjusted output calibration tone of VSA 108b corresponding to calibration tone 314. The third calibration constant may further be determined such that the output calibration tone corresponding to calibration tone 314 has a magnitude matching the known magnitude of calibration tone 314, and/or the magnitude of the output calibration tone of VSA 108b corresponding to calibration tone 314.

The calibration constants for each of the VSAs should be determined, or re-determined, each time the phases of the VSAs change relative to each other. For example, the relative phases of the VSAs may change if the relative phases of the LOs of the VSAs change. This may occur, e.g., if the LO frequencies of one or more VSAs change and the one or more VSAs are relocked. In some VSAs, the phase of the LO can be made to be deterministic. If this is the case, then a calibration constant may be determined once and stored for each frequency of the VSA. The stored calibration constant may then be recalled at some future time without the need for recalibration.

Transmit Path

In a transmit path, spectral stitching may be performed by using a plurality N of vector signal generators (VSGs) to generate an output analog transmit (TX) signal, such as an RF signal, where each VSG handles a respective frequency band of the signal. Together the respective frequency bands comprise an aggregate frequency band of interest. The outputs of the N VSAs may therefore be combined to form a composite signal having a bandwidth on the order of N times the bandwidth of each individual VSG, thus covering the entire aggregate frequency band.

Figure 7:
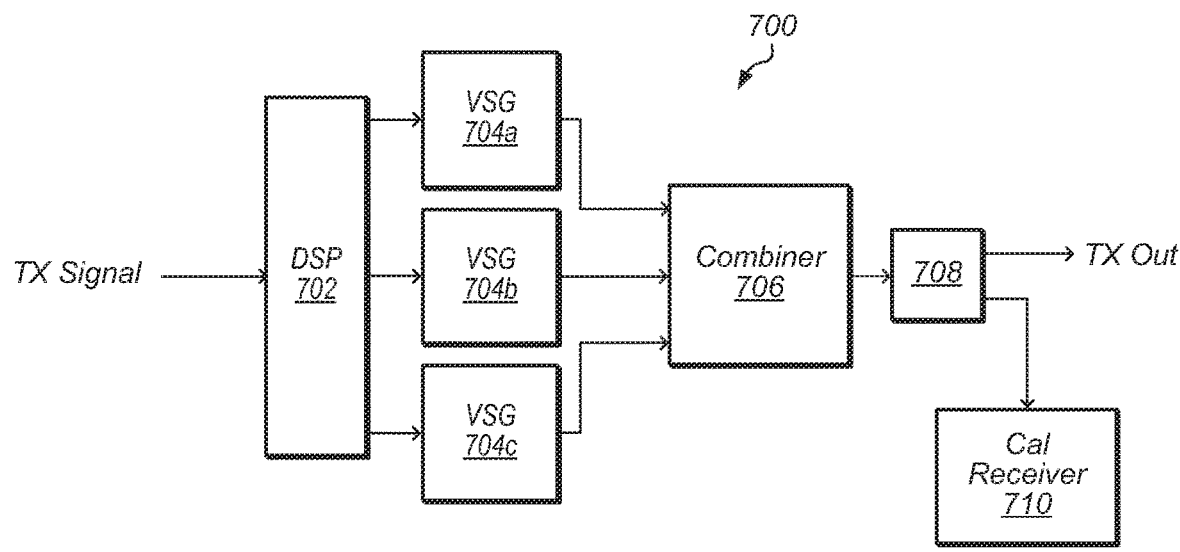
FIG. 7 is a block diagram illustrating an embodiment of a system for performing spectral stitching in a transmit path.

FIG. 7 illustrates a block diagram of an embodiment of a system 700 for performing spectral stitching in a signal path generating an output analog signal. As shown in FIG. 7, the system 700 includes three VSGs 704a-c. Other embodiments may include another number N of VSGs. It should be appreciated that the terms "VSG" and "vector signal generator," as used herein, may encompass any type of signal generator, transmitter, or other device capable of converting, or configured to convert, a digital input signal to an analog output signal.

A digital input signal, illustrated in FIG. 7 as the "TX Signal", may be provided to the system. The input TX Signal may comprise a complex digital signal having a bandwidth that is larger than the bandwidth of each respective VSG. Therefore, each of the VSGs 704a-c may be provided with a respective component signal comprising at least a portion of the input TX Signal. Specifically, each component signal may comprise a respective frequency band of the input TX Signal, and each of the VSGs 704a-c may process the respective frequency band. Each respective frequency band may have a respective center frequency having a respective frequency offset from an aggregate center frequency of the aggregate frequency band.

To ensure continuity across the full aggregate frequency band, the respective frequency bands should overlap. Thus, in order for the outputs of the VSGs 704a-c to be recombined to accurately represent an analog version of the aggregate frequency band of the digital input signal, the component signals may be further processed to provide continuity through the regions of overlap. Each of the VSGs 704a-c may therefore comprise signal processing capabilities beyond those traditionally included in a VSG. Alternatively, such further processing may be performed by signal processing circuitry outside of the VSGs 704a-c, such as by the digital signal processing (DSP) block 702, which is described more fully below. Such an embodiment would allow a user to implement the present invention using standard off-the-shelf VSGs. In other embodiments, each of the VSGs 704a-c may not comprise a stand-alone VSG. For example, each of the VSGs 704a-c may be implemented as a signal processing path on a programmable hardware element, multiprocessor system, etc.

Once the further processing has been performed, e.g. by the DSP block 702 or by each of the VSGs 704a-c, each of the VSGs 704a-c may convert the respective component signal to an analog signal. Each of the VSGs 704a-c may also up-convert the respective component signal such that the aggregate center frequency is located at a desired carrier frequency, and each respective center frequency is offset from the desired carrier frequency by the respective frequency offset.

The combiner 706 may comprise a power combiner with a plurality of inputs, or may comprise any other hardware for combining analog signals, as known in the art. The combiner 706 may receive as inputs the outputs of the VSGs 704a-c, and may output a composite signal comprising a combination of its inputs.

A power splitter 708 may provide copies of the composite signal as an output of the system, i.e. as "TX Out" shown in FIG. 7, and also to a calibration receiver 710. The calibration receiver 710 may be used to receive one or more calibration tones for use in determining calibration constants for one or more of the VSGs 704a-c, as discussed below. The calibration receiver 710 may be phase locked to the VSGs 704a-c.

Figure 8:
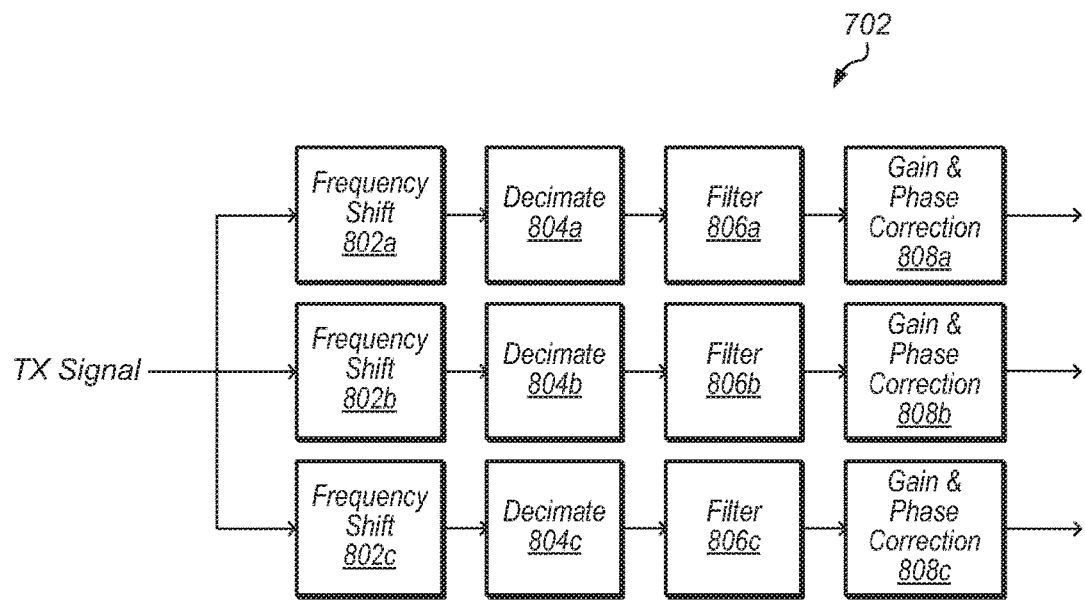
FIG. 8 is a block diagram illustrating an embodiment of a digital signal processing block for use in the system of FIG. 7.

FIG. 8 is a block diagram illustrating the DSP block 702 in greater detail. The DSP block 702 may comprise a plurality of parallel processing paths, each of which may process one of the respective component signals. In some embodiments, the DSP block 702 may be separate from the VSGs 704a-c, as shown in FIG. 7. In other embodiments, a respective one of the parallel processing paths of the DSP block 702 may be included in each of the VSGs 704a-c. For example, blocks 802a, 804a, 806a, and 808a may be included in VSG 704a; blocks 802b, 804b, 806b, and 808b may be included in VSG 704b; and blocks 802c, 804c, 806c, and 808c may be included in VSG 704c.

In some embodiments, each of the frequency shift blocks 802a-c may receive a copy of the entire digital input signal. In other embodiments, each of the frequency shift blocks 802a-c may receive only a respective portion of the digital input signal comprising a respective frequency band.

FIG. 3a illustrates an exemplary embodiment of frequency bands as received by the frequency shift blocks 802a-c, represented in the frequency domain. In this example, frequency band 302 represents the frequency band of the frequency shift block 802a (i.e. VSG 704a), frequency band 304 represents the frequency band of the frequency shift block 802b (i.e. VSG 704b), and frequency band 306 represents the frequency band of the frequency shift block 802c (i.e. VSG 704c). The region covered by frequency bands 304-306 together represents the aggregate frequency band identified by an aggregate center frequency. Each respective center frequency is offset from the aggregate center frequency by a respective frequency offset. In some circumstances a respective center frequency may be 0 Hz, as in the example of frequency band 304.

The frequency bands may overlap to avoid gaps within the aggregate frequency band. For example, the region 308 represents a region of overlap between frequency band 302 and frequency band 304 (i.e. between the respective component signals of VSGs 704a and 704b), and the region 310 represents the region of overlap between frequency band 304 and frequency band 306 (i.e. between the respective component signals of VSGs 704b and 704c).

At the frequency shift blocks 802a-c, each of the respective component signals may be shifted to baseband. Where the aggregate frequency band is initially at baseband, this means that each respective component signal is frequency-shifted by the negative of the respective frequency offset. For example, if the respective frequency offset of the respective component signal being processed by the frequency shift block 802c is 60 MHz, then the frequency shift block 802c would frequency shift the respective component signal by −60 MHz.

At the decimate blocks 804a-c, each respective component signal may be decimated to a rate that is less than or equal to the maximum sample rate of the corresponding VSG. This decimation may comprise merely dropping samples. Alternatively, this decimation may comprise alias-protected decimation, utilizing an alias protection filter.

The filter blocks 806a-c are similar to the filter blocks 204a-c of FIG. 2. Because the respective frequency bands of the respective component signals overlap in frequency, as shown in FIG. 3, the overlap regions should be filtered to prevent power spikes in the overlap regions when the respective signals are combined by the combiner 706. In other words, the respective component signals should be filtered such that their sum appears continuous. Specifically, the respective component signals may be filtered such that the sum of overlapping signals provides a unity response at all points within the aggregate frequency band.

Various filter shapes may be used to accomplish this. For example, FIG. 4 illustrates the response of a half-band filter, where the solid trace 402 represents a filter response for a first VSG and the dotted trace 404 represents a filter response for a second VSG with an overlapping frequency band. In FIG. 4, the crossover point is located at 30 MHz where there is a 10 MHz crossover region. While a half-band filter inherently has the needed spectral characteristics to filter overlapping frequency bands to sum together to produce unity gain, it forces the crossover point to occur at the sampling frequency divided by four, fs/4. In other embodiments, this crossover may be moved further out in frequency using other filter methods, e.g., to increase the effectiveness of the natural instantaneous bandwidth of each device.

At the gain and phase correction blocks 808a-c, the magnitude and phase of each respective component signal may be adjusted to make the spectrum continuous through the regions of overlap. This gain and phase correction may comprise a complex multiply of each of one or more of the respective component signals with a respective calibration constant. Determining a calibration constant for each of the gain and phase correction blocks 808a-c is discussed below.

Determining VSG Calibration Constants

In order to adjust the magnitudes and phases of the respective signals in the transmit path to provide continuity through the regions of overlap, the relative magnitudes and phases between the respective signals without adjustment may be determined using one or more calibration tones. This may be performed in multiple ways.

For example, to determine calibration constants for a system such as the system 700 shown in FIGS. 7-8, the system 700 may be set to a calibration mode, which may operate according to one of the following approaches.

In a first approach, a calibration tone may be added to the input TX Signal within a region of overlap of the respective frequency band of the first VSG and the respective frequency band of a second, adjacent VSG. The calibration tone may be generated by a digital calibration tone generator (not shown), which may be comprised within the DSP block 702, or may be a separate component. The calibration tone may be added to the input TX Signal using a switch, a multiplexer, or by using any other method known in the art. Preferably, the calibration tone may be generated at the center of the region of overlap. For example, the calibration tone generator may generate a calibration tone 312 within the region 308, as shown in FIG. 3b. The respective outputs of the VSG 704a and the VSG 704b will thus each include a representation of the calibration tone. With the output of the VSG 704b turned off or disabled, the magnitude and phase of the representation of the calibration tone 312 present in the output of the VSG 704a may be measured by the calibration receiver 710. The output of the first VSG may then be turned off or disabled, and the output of the second VSG may be enabled. For example, the VSG 704b may be enabled. The representation of the calibration tone 312 present in the output of the VSG 704b may then be measured by the calibration receiver 710. Where the calibration receiver 710 is phase-locked with the VSGs 704a and 704b throughout the time when the two measurements are made, a relative phase difference of the VSGs 704a and 704b may be determined by comparing the phases of the two representations of the calibration tone 312, as measured by the calibration receiver 710. A relative magnitude difference of the VSGs 704a and 704b may also be determined by comparing the magnitudes of the two representations of the calibration tone 312. A calibration constant may then be determined for one or more of the VSGs 704a and 704b, based on the determined relative phase difference and the determined relative magnitude difference. This method may be repeated for each of the regions of overlap.

In a second approach, an iterative method may be used to determine the relative magnitude and phases. In this method, both the VSG 704a and the VSG 704b may each simultaneously generate an output comprising a representation of the calibration tone 312. Then, the magnitude and phase of the VSG 704b may be iteratively adjusted, seeking to force the respective representations of the calibration tone 312 present in the respective outputs of VSG1 and VSG2 to deconstructively interfere. In other words, the magnitude and phase of the representation of the calibration tone 312 present in the output of the VSG 704b may be iteratively adjusted until the total output power at the frequency of the representation of the calibration tone 312 is minimized. The calibration constant may then be determined by negating the VSG 704b result to rotate it by 180 degrees. This procedure may then be repeated for each overlap region. While this second approach would take longer than the direct measurement of the first approach, this second approach does not require the calibration receiver 710 to be phase locked to the VSGs. Moreover, since the calibration receiver 710 is only making unlocked power measurements, the calibration receiver 710 may be replaced by a power meter, thereby simplifying the hardware requirements of the calibration circuitry.

Figure 3C:
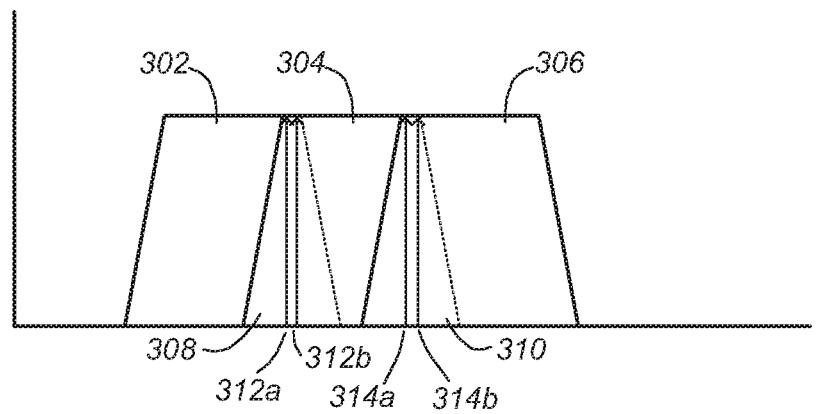

In a third approach, respective calibration tones from the VSG 704a and the VSG 704b may be at different frequencies but with some known relationship. In this case the VSG 704a and the VSG 704b may each generate a respective calibration tone at the same time in a synchronized manner, and the magnitude and phase differences may be simultaneously sampled. For example, FIG. 3c illustrates calibration tone 312a, which may be generated by the VSG 704a, and calibration tone 312b, which may be generated by the VSG 704b. Similarly, calibration tones 314a and 314b may be generated by the VSG 704b and the VSG 704c, respectively. The complex calibration constant may be computed by taking into consideration the known relationship between the calibration tones. For example, a calibration constant may be determined for one or more of the VSGs 704a and 704b, based on the known relationship between the calibration tones 312a and 312b.

The calibration constants for each of the VSGs should be determined, or re-determined, each time the phases of the VSGs change relative to each other. For example, the relative phases of the VSGs may change if the relative phases of the LOs of the VSGs change. This may occur, e.g., if the LO frequencies of one or more VSGs change and the one or more VSGs are relocked. In some VSGs, the phase of the LO can be made to be deterministic. If this is the case, then a calibration constant may be determined once and stored for each frequency of the VSG. The stored calibration constant may then be recalled at some future time without the need for recalibration.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for processing a digital signal, the method comprising:
    frequency-shifting each of a plurality of component signals, each component signal comprising a respective frequency band of interest of the digital signal, each frequency band of interest having a region of overlap with a frequency band of interest of at least one other component signal, such that a respective center frequency of each frequency band of interest is shifted to baseband;
    shaping a frequency response of the component signals by a digital filter;
    converting at least the frequency bands of interest of the component signals to respective analog signals using respective vector signal generators, wherein the component signals are phase-locked; and
    combining the respective analog signals to obtain a composite signal, wherein a shape of the digital filter has a reduced gain in at least a portion of the regions of overlap to reduce artificial increases in magnitude in the composite signal.

2. The method of claim 1, wherein converting a frequency band of interest to a respective analog signal comprises sampling at least a portion of the digital signal corresponding to the frequency band of interest.

3. The method of claim 1, further comprising adjusting at least one of gain and phase of the component signals, such that the composite signal has a continuous frequency response over an aggregate frequency band.

4. The method of claim 3, wherein said converting at least the frequency bands of interest of the component signals is configured to cause an aggregate center frequency of the aggregate frequency band to be located at a desired carrier frequency, and each respective center frequency of a respective frequency band of interest to be offset from the desired carrier frequency by a respective frequency offset by which the respective frequency band of interest was shifted during said frequency-shifting.

5. The method of claim 1, further comprising decimating at least the frequency bands of interest of the component signals to a rate that is less than or equal to a maximum sample rate of the vector signal generators.

6. The method of claim 5, further comprising adjusting at least one of gain and phase of the component signals, such that the composite signal has a continuous frequency response over the aggregate frequency band, wherein said shaping a frequency response of the component signals is performed after said decimating and before said adjusting at least one of gain and phase.

7. The method of claim 6, wherein the digital filter is a half-band filter.

8. An apparatus for processing a digital signal, the apparatus comprising:
    a first vector signal generator configured to:
        receive a first component signal comprising a first frequency band of the digital signal; and
        convert at least the first frequency band to a first analog signal;
    a second vector signal generator configured to:
        receive a second component signal phase-locked with the first component signal, the second component signal comprising a second frequency band of the digital signal, the second frequency band having a region of overlap with the first frequency band; and
        convert at least the second frequency band to a second analog signal;
    a signal combiner configured to combine the first analog signal and the second analog signal to obtain a composite signal;
    a calibration receiver configured to, while the apparatus is in a calibration mode, compute a calibration constant useable to correct phase mismatch between the first vector signal generator and the second vector signal generator, wherein the calibration constant is computed based on a phase difference between a first version of a calibration tone output by the signal combiner while the first vector signal generator is disabled, and a second version of the calibration tone output by the signal combiner while the second vector signal generator is disabled, wherein the calibration tone is included in the digital signal within the region of overlap between the first frequency band and the second frequency band; and
    a memory configured to store the calibration constant.

9. The apparatus of claim 8, wherein, when the apparatus is not in the calibration mode, the second vector signal generator is further configured to:
    correct phase mismatch between an output of the second vector signal generator and an output of the first vector signal generator, using the stored calibration constant.

10. The apparatus of claim 8, wherein the calibration constant is further useable to correct gain mismatch between the first vector signal generator and the second vector signal generator, wherein the calibration constant is computed further based on a ratio of a magnitude of the first version of the calibration tone and a magnitude of the second version of the calibration tone.

11. The apparatus of claim 8,
wherein the first vector signal generator is further configured to shape a frequency response of the first component signal by a first digital filter;
wherein the second vector signal generator is further configured to shape a frequency response of the second component signal by a second digital filter; and
wherein the first digital filter and the second digital filter have reduced gain in at least a portion of the region of overlap to reduce artificial increases in the composite signal.

12. The apparatus of claim 11, wherein the first digital filter and the second digital filter are half-band filters.

13. The apparatus of claim 8,
wherein the first vector signal generator is configured to shift the first frequency band to baseband;
wherein the second vector signal generator is configured to shift the second frequency band to baseband;
wherein said converting at least the first frequency band comprises frequency-shifting the first analog signal such that the calibration tone occurs at a particular frequency, and said converting at least the second frequency band comprises frequency-shifting the second analog signal such that the calibration tone occurs at the particular frequency.

14. The apparatus of claim 13,
wherein the first vector signal generator is further configured to decimate the first component signal to a rate that is less than or equal to a maximum sample rate of the first vector signal generator, wherein said decimating the first component signal is performed after said shifting the first frequency band to baseband and before said converting the first frequency band; and
wherein the second vector signal generator is further configured to decimate the second component signal to a rate that is less than or equal to a maximum sample rate of the second vector signal generator, wherein said decimating the second component signal is performed after said shifting the second frequency band to baseband and before said converting the second frequency band.

* * * * *

UNITED STATES PATENT AND TRADEMARK OFFICE
CERTIFICATE OF CORRECTION

PATENT NO. : 10,624,094 B2  
APPLICATION NO. : 15/918905  
DATED : April 14, 2020  
INVENTOR(S) : Stephen L. Dark, Daniel J. Baker and Johnathan R. W. Ammerman Page 1 of 1

It is certified that error appears in the above-identified patent and that said Letters Patent is hereby corrected as shown below:

On the Title Page

Item (63), under "Related U.S. Application Data":  
Line 1, please delete "Continuation of application No. 14/611,700, filed on...", and substitute  
--Continuation of application no. 15/425,304, filed on Feb. 6, 2017, now Pat. No. 9,918,316, which is a continuation of application No. 14/611,700, filed on..."--.

Signed and Sealed this  
First Day of September, 2020

Andrei Iancu  
*Director of the United States Patent and Trademark Office*